United States Patent
Cheng et al.

(10) Patent No.: US 11,049,797 B2
(45) Date of Patent: Jun. 29, 2021

(54) METHOD FOR MANUFACTURING A SEMICONDUCTOR STRUCTURE COMPRISING A SEMICONDUCTOR DEVICE LAYER FORMED ON A TEM, PORARY SUBSTRATE HAVING A GRADED SIGE ETCH STOP LAYER THEREBETWEEN

(71) Applicant: TAIWAN SEMICONDUCTOR MANUFACTURING COMPANY LTD., Hsinchu (TW)

(72) Inventors: Yu-Hung Cheng, Tainan (TW); Shih-Pei Chou, Tainan (TW); Yeur-Luen Tu, Taichung (TW); Alexander Kalnitsky, San Francisco, CA (US); Tung-I Lin, Tainan (TW); Wei-Li Chen, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/130,182

(22) Filed: Apr. 15, 2016

(65) Prior Publication Data
US 2017/0301611 A1 Oct. 19, 2017

(51) Int. Cl.
*H01L 21/768* (2006.01)
*H01L 23/48* (2006.01)
(Continued)

(52) U.S. Cl.
CPC ........ *H01L 23/481* (2013.01); *H01L 21/2007* (2013.01); *H01L 21/30604* (2013.01);
(Continued)

(58) Field of Classification Search
CPC .......... H01L 21/02381; H01L 21/0245; H01L 21/0251; H01L 29/1054; H01L 21/2007;
(Continued)

(56) References Cited

U.S. PATENT DOCUMENTS

| 5,013,681 | A | * | 5/1991 | Godbey | .................. G03F 1/22 |
| | | | | | 257/E21.219 |
| 6,940,089 | B2 | * | 9/2005 | Cheng | ............... H01L 21/76256 |
| | | | | | 257/19 |

(Continued)

FOREIGN PATENT DOCUMENTS

CN 1630933 A 6/2005
CN 104810396 A 7/2015

OTHER PUBLICATIONS

Office Action and Cited References dated Jan. 28, 2021 issued by the China National Intellectual Property Administration for Application No. 201611225663.9

*Primary Examiner* — Anh D Mai
(74) *Attorney, Agent, or Firm* — WPAT, P.C., Intellectual Property Attorneys; Anthony King

(57) ABSTRACT

The present disclosure provides a semiconductor structure, including: a semiconductor device layer including a first surface and a second surface, wherein the first surface is at a front side of the semiconductor device layer, and the second surface is at a backside of the semiconductor device layer; an insulating layer above the second surface of the semiconductor device; and a through-silicon via (TSV) traversing the insulating layer. Associated manufacturing methods of the same are also provided.

20 Claims, 16 Drawing Sheets

(51) Int. Cl.
*H01L 27/12* (2006.01)
*H01L 21/306* (2006.01)
*H01L 21/20* (2006.01)
*H01L 21/762* (2006.01)
*H01L 21/683* (2006.01)

(52) U.S. Cl.
CPC .... *H01L 21/6835* (2013.01); *H01L 21/76256* (2013.01); *H01L 21/76829* (2013.01); *H01L 21/76898* (2013.01); *H01L 27/1266* (2013.01); *H01L 2221/68359* (2013.01)

(58) Field of Classification Search
CPC ......... H01L 21/30604; H01L 21/76256; H01L 27/1266
See application file for complete search history.

(56) References Cited

U.S. PATENT DOCUMENTS

| | | | |
|---|---|---|---|
| 8,367,521 B2 * | 2/2013 | Daval | H01L 21/30604 257/625 |
| 2003/0153161 A1 | 8/2003 | Chu et al. | |
| 2003/0203600 A1 * | 10/2003 | Chu | H01L 21/02381 438/479 |
| 2012/0098121 A1 * | 4/2012 | Chen | H01L 23/3171 257/737 |
| 2013/0200438 A1 * | 8/2013 | Liu | G01N 27/414 257/253 |
| 2014/0339667 A1 * | 11/2014 | Takahashi | H01L 23/481 257/432 |
| 2015/0206936 A1 | 7/2015 | Huang | |

* cited by examiner

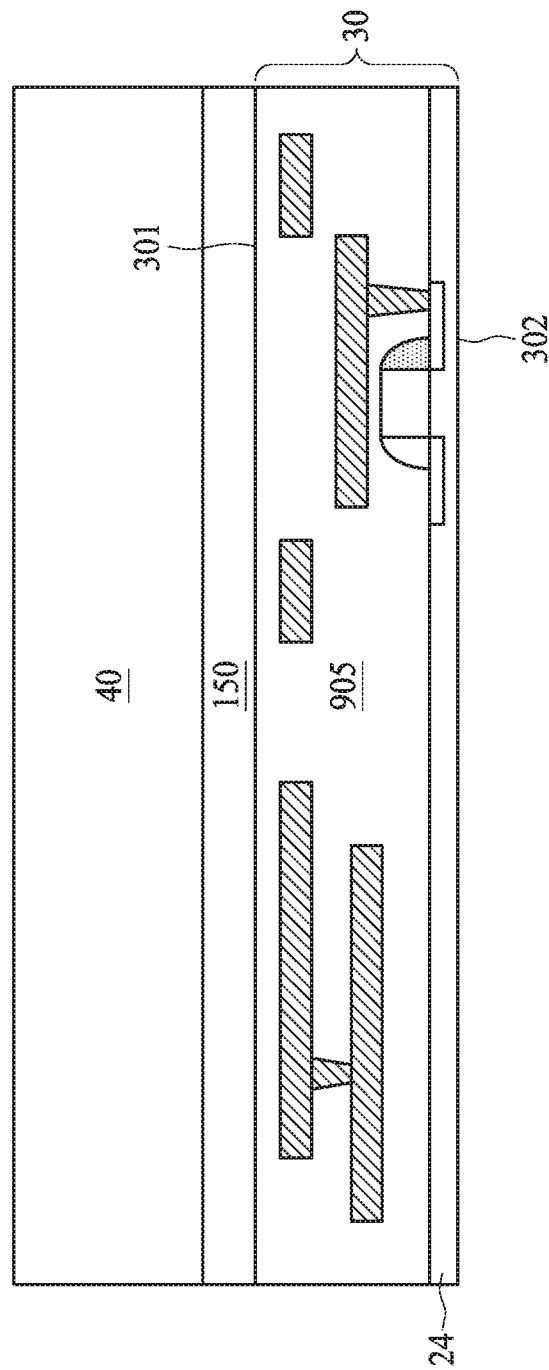

METHOD FOR MANUFACTURING A SEMICONDUCTOR STRUCTURE COMPRISING A SEMICONDUCTOR DEVICE LAYER FORMED ON A TEM, PORARY SUBSTRATE HAVING A GRADED SIGE ETCH STOP LAYER THEREBETWEEN

BACKGROUND

The present disclosure relates to a semiconductor structure with a silicon-on-insulator structure and manufacturing method thereof.

Silicon-on-insulator (SOI) structures may consist of a thick inactive base layer, typically but not necessarily made of silicon, that provides mechanical stability, an electrically insulating intermediate layer, typically but not necessarily made of silicon dioxide ($SiO_2$), and a thin top layer of high-quality single-crystalline silicon which contains microelectronic devices which have been patterned into it, e.g. by photolithographic means. There are many thick and thin film thicknesses to the appropriate geometry.

An SOI substrate, each has been found lacking in some respect. In general, certain of the methods proposed to date will produce thickness SOI wafers in relatively low yield and at relatively high cost. Other methods which have been proposed to date will produce SOI wafers having device layers which have an unacceptable variation or which contain defects.

Although various approaches have been proposed for fabricating SOI wafers with defect-free device layers having relatively low variation, but these methods typically produce SOI wafers in relatively high yield and at a favorable cost, but these methods typically produce thickness variation or which contains defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
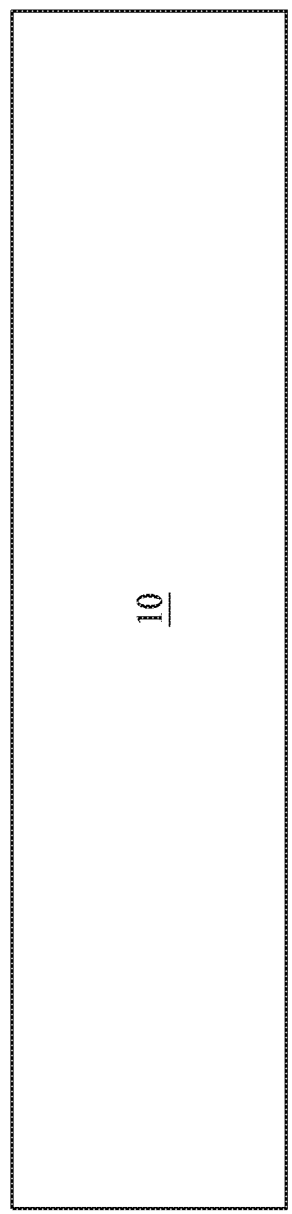
FIG. 1 to FIG. 12B show schematic cross-sectional views of a semiconductor structure and depict the sequence of operations for fabrication the semiconductor structure, according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure provides a semiconductor structure having a reverse Silicon-On-Insulator (SOI) structure with a through-silicon via (TSV) traversing the insulator of the SOI structure. In particular, the TSV couples semiconductor circuitry on a front side of a device layer to semiconductor circuitry on a backside of the device layer. The present disclosure also provides a manufacturing method of the semiconductor structure described herein.

Referring to FIGS. 1 to 12B, which depict a sequence of operations for fabrication the semiconductor structure, according to some embodiments of the present disclosure. In FIG. 1, a primary substrate 10 is provided. The primary substrate 10 is comprised of, for example, a P- or an N-silicon substrate. Such a commercially available substrate is of a desired thickness uniformity tolerance of 10 to 20 μm. In other words, the thickness non-uniformity of 10 to 20 μm. In some embodiments, the primary substrate may be over about 700 μm thick. In some embodiments, since the primary substrate 10 is to be thinned to less than about 5 μm in the subsequent operations, the primary substrate 10 is called a temporary substrate in the present disclosure. In some embodiments, the primary substrate 10 is a P+ wafer, having a boron (B) concentration of between about 1E18 and about 5E20 boron atoms/$cm^3$, preferably between about 1E18 and about 3E20 boron atoms/$cm^3$, a resistivity of about 0.01 to about 0.02 ohm-cm, preferably a resistivity of about 0.01 to about 0.015 ohm-cm, a thickness of about 300 μm to 800 μm and a diameter which may be, for example, 100, 125, 150, 200 mm or more. In some embodiments, a layer of low temperature oxide (LTO) may be on a bottom surface of the primary substrate 10 and provided along with the primary substrate 10.

Figure 2:
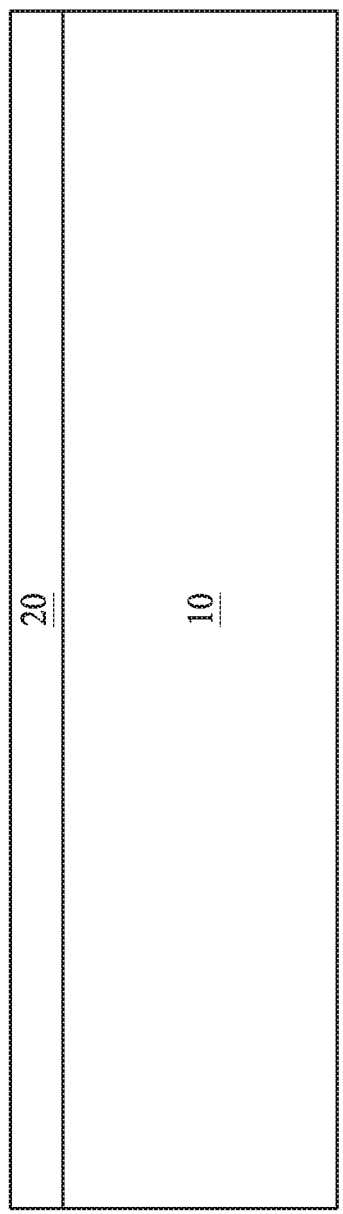
Figure 3:
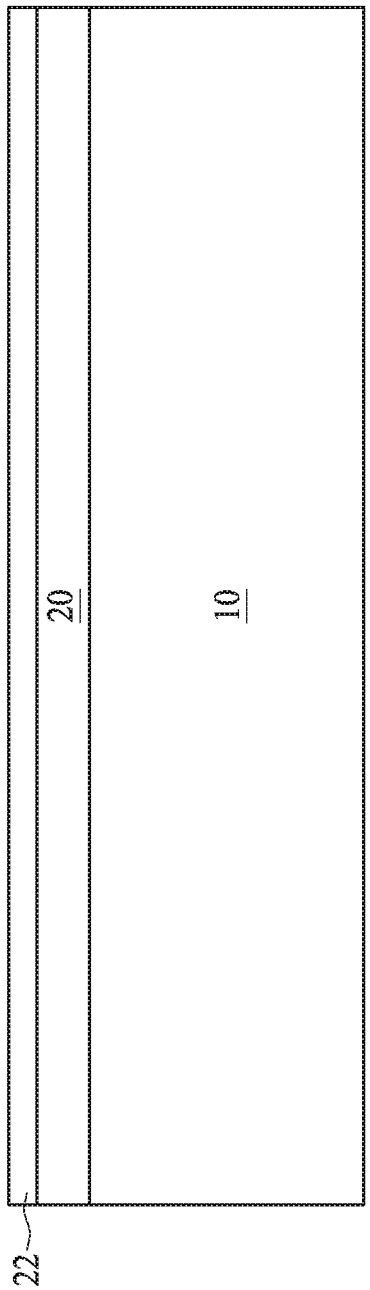
Figure 4:
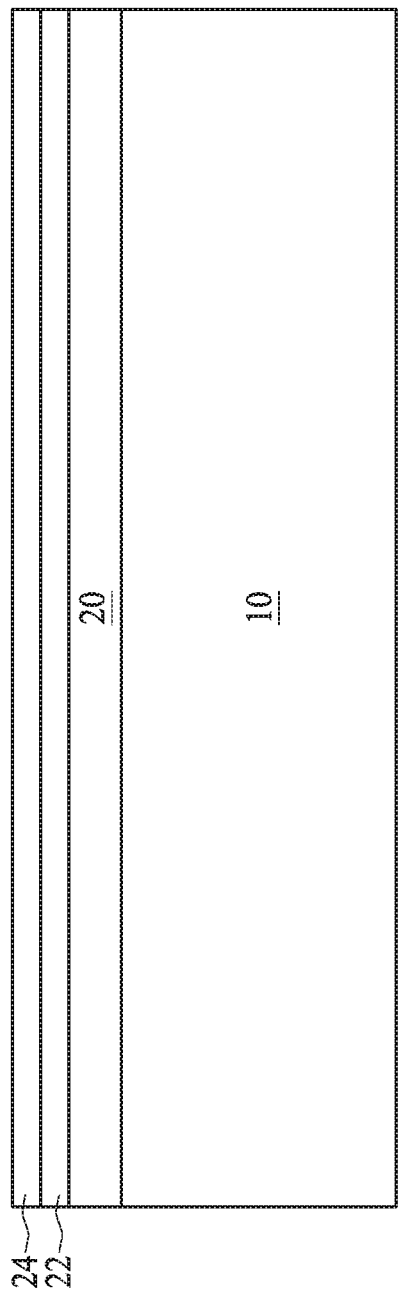

Referring to FIGS. 2 to 4, a formation sequence of an epitaxial tri-layer is illustrated. In FIG. 2, an epitaxial buffer layer 20 is formed over the primary substrate 10. The epitaxial buffer layer 20 may be comprised of P-silicon epitaxial in the exemplary embodiment. In the exemplary embodiment, the epitaxial buffer layer 20 is deposited to have a thickness of about 3.5 µm. In FIG. 3, an etch selectivity layer 22 is formed over the epitaxial buffer layer 20. In the exemplary embodiment, the etch selectivity layer 22 is deposited to have a thickness of about 200 nm or less, and present etch selectivity by incorporating at least one of Group III to Group V elements of the Periodic Table into the same material composing the epitaxial buffer layer 20. In FIG. 4, a silicon epitaxial layer 24 is formed over the etch selectivity layer 22. In the exemplary embodiment, the silicon epitaxial layer 24 is deposited to have a thickness of about 100 nm or less.

The epitaxial buffer layer 20, the etch selectivity layer 22 and the silicon epitaxial layer 24 commonly constitute the epitaxial tri-layer which is epitaxial grown by low temperature techniques known in the art, such as, gas source molecular beam epitaxy (MBE), ultra high vacuum chemical vapor deposition (UHVCVD), or low temperature atmospheric pressure (AP) CVD, or other vapor depositions. Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using electrochemical reaction include electroplating, electro-less plating, and the like. Other examples of deposition include pulse laser deposition (PLD), and atomic layer deposition (ALD).

In some embodiments, the etch selectivity layer 22 includes silicon germanium (SiGe) with a lattice constant greater than the materials made of the epitaxial buffer layer 20 and the silicon epitaxial layer 24. Germanium in the etch selectivity layer 22 may have a concentration of about 20%. In order to reduce dislocation, the concentration of germanium may gradually increase from about 0% to about 20% within 40 nm distanced from the interface between the epitaxial buffer layer 20 and the etch selectivity layer 22. Similarly, the concentration of germanium may gradually decrease from about 20% to about 0% within 40 nm distanced from the interface between the etch selectivity layer 22 and the silicon epitaxial layer 24. In some embodiments, depending on a required selectivity performance, germanium in the etch selectivity layer 22 may have a concentration greater or less than 20%. For example, the concentration of germanium may be in a range from about 20% to about 30%.

In some embodiments, the etch selectivity layer 22 is provided with a heavily doped boron region placed by diffusion or implantation into the silicon. The etch selectivity layer 22 may have a boron concentration of about or greater than 1E18 boron atoms/cm$^3$. In some embodiments, the etch selectivity layer 22 may contain other dopant of Group III to Group V elements of the Periodic Table, such as carbon (C), phosphors (P), gallium (Ga), nitrogen (N) or arsenic (As).

Figure 5:
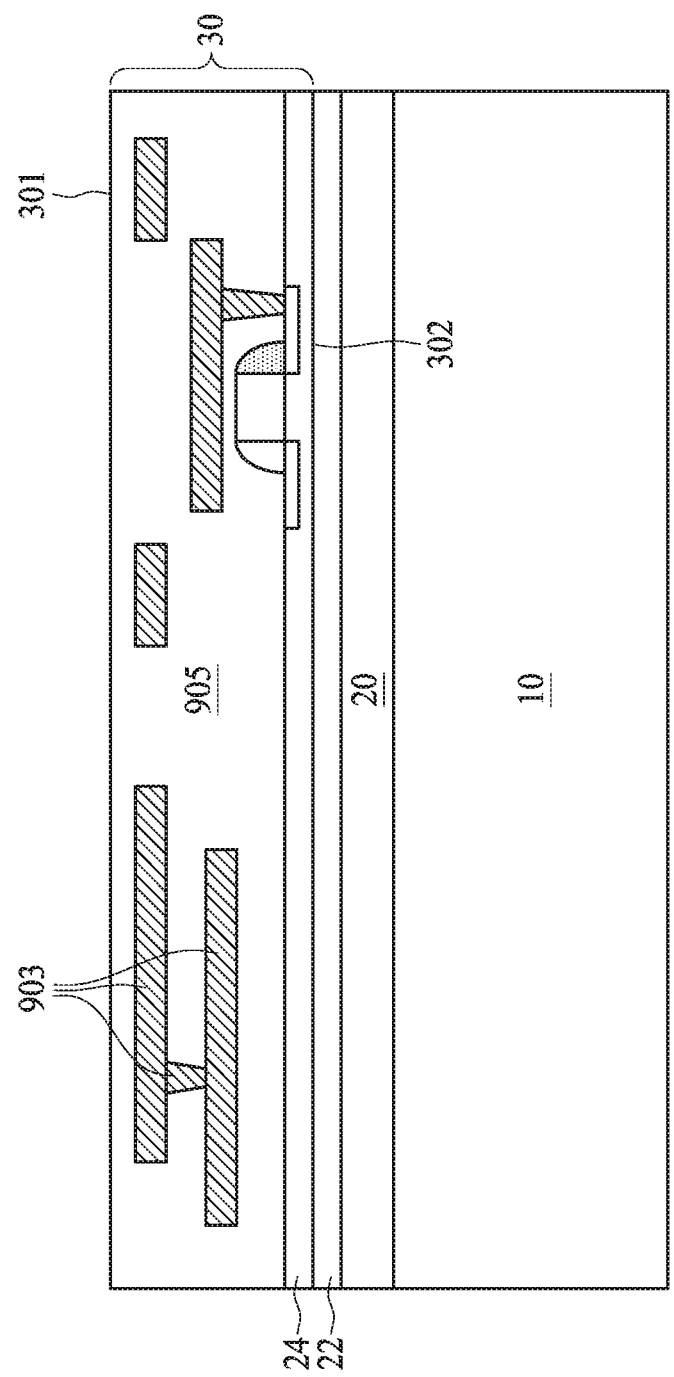

In FIG. 5, an interlayer (or inter-level) dielectric (ILD) layer 905 is formed over the etch selectivity layer 22, wherein the silicon epitaxial layer 24 and the ILD layer commonly form a device layer 30. In some embodiments, the device layer 30 is epitaxially grown and followed by various operations to form, for example, active regions such as a transistor region of a semiconductor device. The thickness of the device layer 30 is preferably about 1.5 µm to 5 µm thick and of a conductivity type and resistivity type (e.g., n or p-) to allow the use of preferential etchants as described herein. The device layer 30 is formed over the etch selectivity layer 22 by epitaxial techniques known in the art, such as, gas source molecular beam epitaxy ("MBE"), ultra high vacuum chemical vapor deposition ("UHCVD"), or atmospheric pressure chemical vapor deposition ("APCVD"). Standard pre-epitaxial cleaning steps such as high temperature (e.g., at least about 900° C.) hydrogen pre-bakes may optionally be employed. In addition, an oxide layer may optionally be formed on device layer 30. As shown in FIG. 5, the device layer 30 includes a first surface 301 and a second surface 302. The first surface 301 is a front side of the device layer 30, and the second surface 302 is a backside of the device layer 30. In the current operation, the second surface 302 of the device layer 30 is in contact with the etch selectivity layer 22. In some embodiments, the semiconductor device may include at least a logic structure with a transistor region and metallization layers.

The device layer 30 further includes a multilayer interconnect (MLI) 903. The MLI 903 is coupled to various components of the transistor region. The MLI 903 includes various conductive features, which may be vertical interconnects, such as contacts and/or vias, and/or horizontal interconnects, such as conductive lines. The various conductive features include conductive materials, such as metal. In an example, metals including aluminum, aluminum/silicon/copper alloy, titanium, titanium nitride, tungsten, polysilicon, metal silicide, or combinations thereof, may be used, and the various conductive features may be referred to as aluminum interconnects. Aluminum interconnects may be formed by a process including physical vapor deposition (PVD), chemical vapor deposition (CVD), or combinations thereof. Other manufacturing techniques to form the various conductive features may include photolithography processing and etching to pattern conductive materials to form the vertical and horizontal connects. Still other manufacturing processes may be implemented to form the MLI 903, such as a thermal annealing to form metal silicide. The metal silicide used in multilayer interconnects may include nickel silicide, cobalt silicide, tungsten silicide, tantalum silicide, titanium silicide, platinum silicide, erbium silicide, palladium silicide, or combinations thereof. Alternatively, the various conductive features may be copper multilayer interconnects, which include copper, copper alloy, titanium, titanium nitride, tantalum, tantalum nitride, tungsten, polysilicon, metal silicide, or combinations thereof. The copper interconnects may be formed by a process including PVD, CVD, or combinations thereof. The MLI 903 is not limited by the number, material, size, and/or dimension of the conductive features depicted, and thus, the MLI 903 may include any number, material, size, and/or dimension of conductive features depending on design requirements of the device layer 30.

The various conductive features of the MLI 903 are disposed in the ILD layer 905. The ILD layer 905 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK Dow Chemical, Midland, Mich.), polyimide, other suitable material, or combinations thereof. The ILD layer 905 may have a multilayer structure. The ILD layer 905 may be formed by a technique including spin-on coating, CVD, sputtering, or other suitable process. In an example, the MLI 903 and ILD layer 905 may be formed in an integrated process including a damascene process, such as a dual damascene process or single damascene process.

Figure 6:
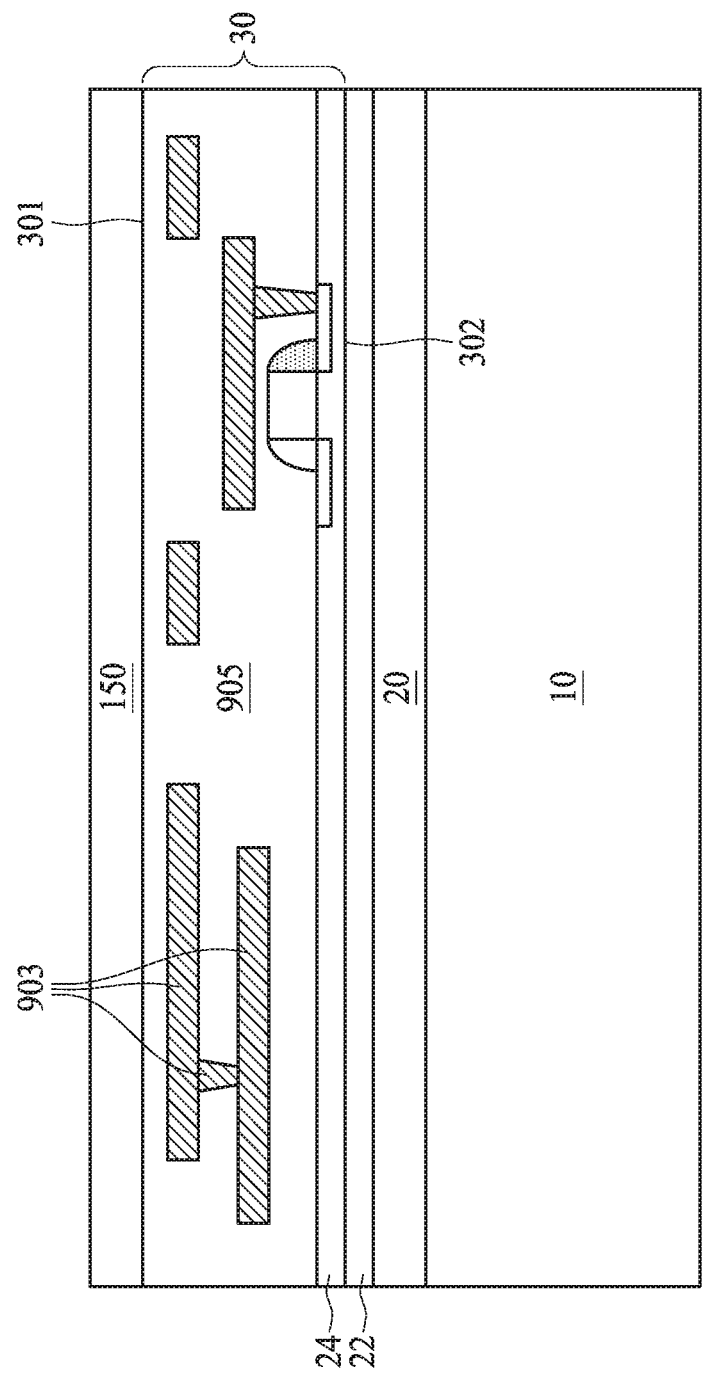
Figure 7:
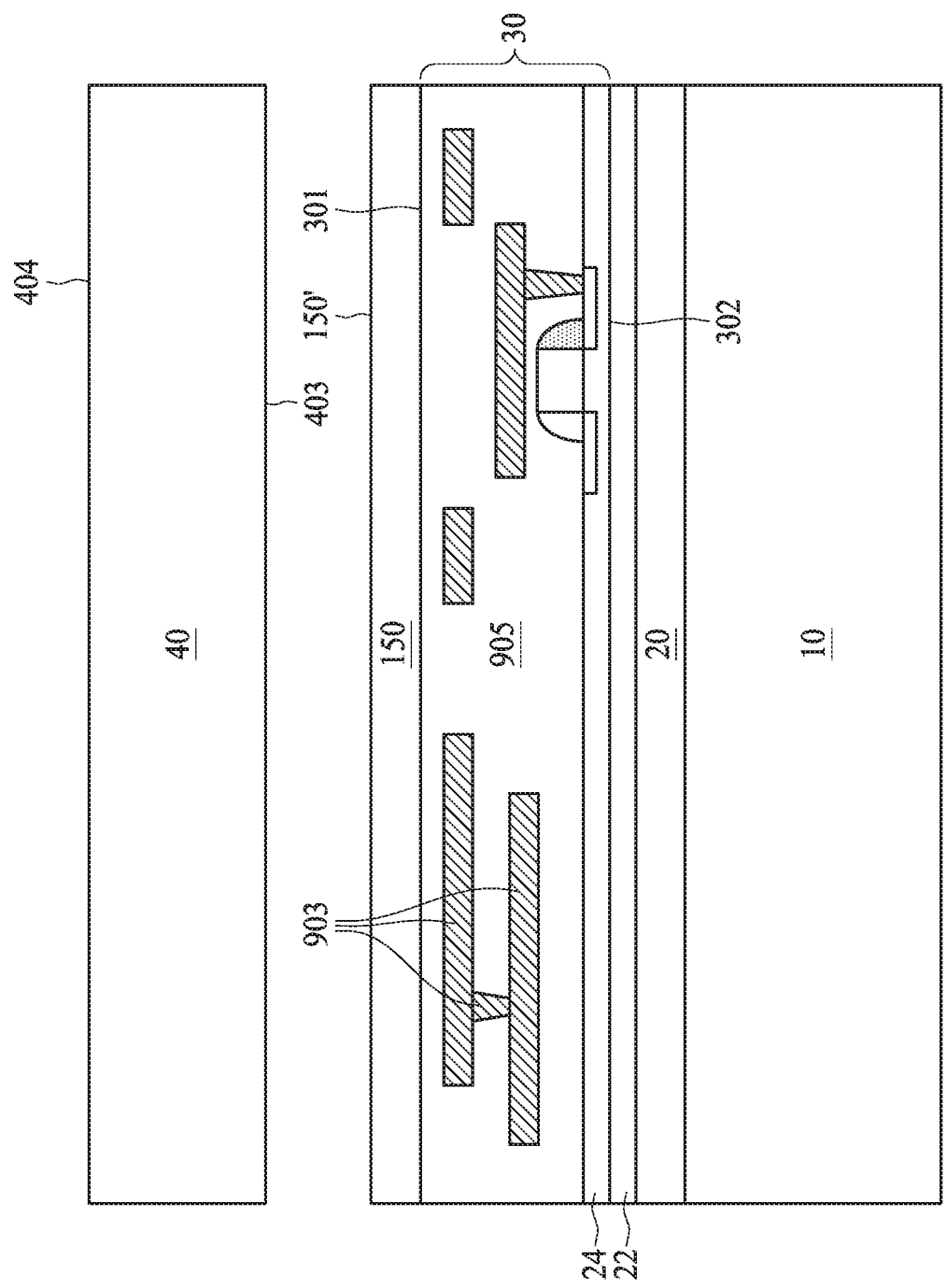
Figure 8:
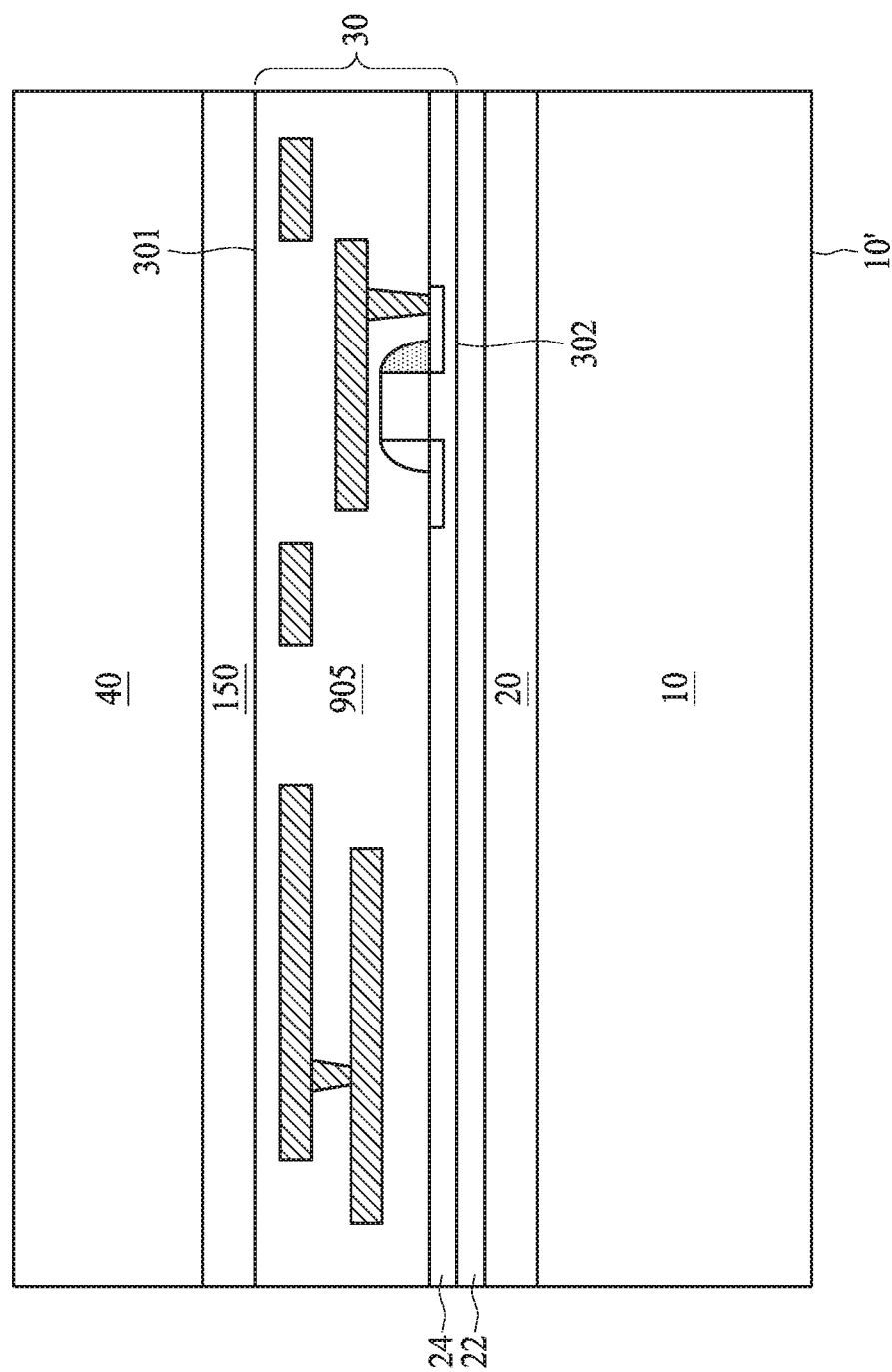

The first surface 301 of the device layer 30 may include layers other than epitaxy layers such as a dielectric layer 150 as shown in FIG. 6 or a hybrid layer including a dielectric materials and metal traces in facilitating, for example, bonding operations. In FIG. 7, A semiconductor substrate 40 is separately prepared and a third surface 403 of the semiconductor substrate 40 is bonded to the dielectric layer 150 of the device layer 30. The semiconductor substrate 40 includes a fourth surface 404 opposite to the third surface 403. In some embodiments, the fourth surface 404 is a backside of the semiconductor substrate 40. In some embodiments, the third surface 403 of the semiconductor substrate 40 may include other layers such as a dielectric layer or a hybrid layer including a dielectric materials and metal traces. Referring to FIGS. 7 to 8, the third surface 403 of the semiconductor substrate 40 is bonded to a fifth surface 150' of the dielectric layer 150.

In some embodiments, the semiconductor substrate 40 may be a carrier substrate possessing sufficient mechanical strength for subsequent processing. Semiconductor substrate 40 may be comprised of an original silicon substrate, similar to primary substrate 10, for example, a P- or an N-silicon substrate, having a diameter which corresponds to the diameter of the device layer 30 and a desired thickness uniformity tolerance of 10 to 20 µm. In some embodiments, because the semiconductor substrate 40 merely serves as a means for handling the primary substrate 10 and the epitaxy layers thereon, the conductivity type and resistivity type of semiconductor substrate 40 is not critical. Advantageously, therefore, semiconductor substrate 40 may be formed from very low cost silicon.

Wafer bonding is well known in the art and only briefly discussed herein. The semiconductor substrate 40 preferably includes silicon substrate, as previously discussed, and further having an oxide layer formed on a top surface of silicon substrate. The dielectric layer 150 or a metallization layer formed over the device layer 30 is placed in contact with semiconductor substrate 40 such that dielectric layer or a metallization layer of the device layer 30 is in intimate contact with oxide layer over the semiconductor substrate 40. Before the two substrates bond together, a plasma treatment may be performed to activate a surface of the oxide layer for bonding strength improvement. Primary substrate 10 and semiconductor substrate 40 are then subjected to a heat treatment for a predetermined period of time until the oxide layer and the dielectric layer or the metallization layer is bonded together. Since the bonding interface has been treated by plasma, the anneal heat-treatment temperature can be down to below about 400 degrees Celsius. The resultant total thickness variation (TTV) of the bonded wafer pair, comprising primary wafer 10 and semiconductor substrate 40, is the sum of the individual TTVs of primary substrate 10 and semiconductor substrate 40.

Figure 9A:
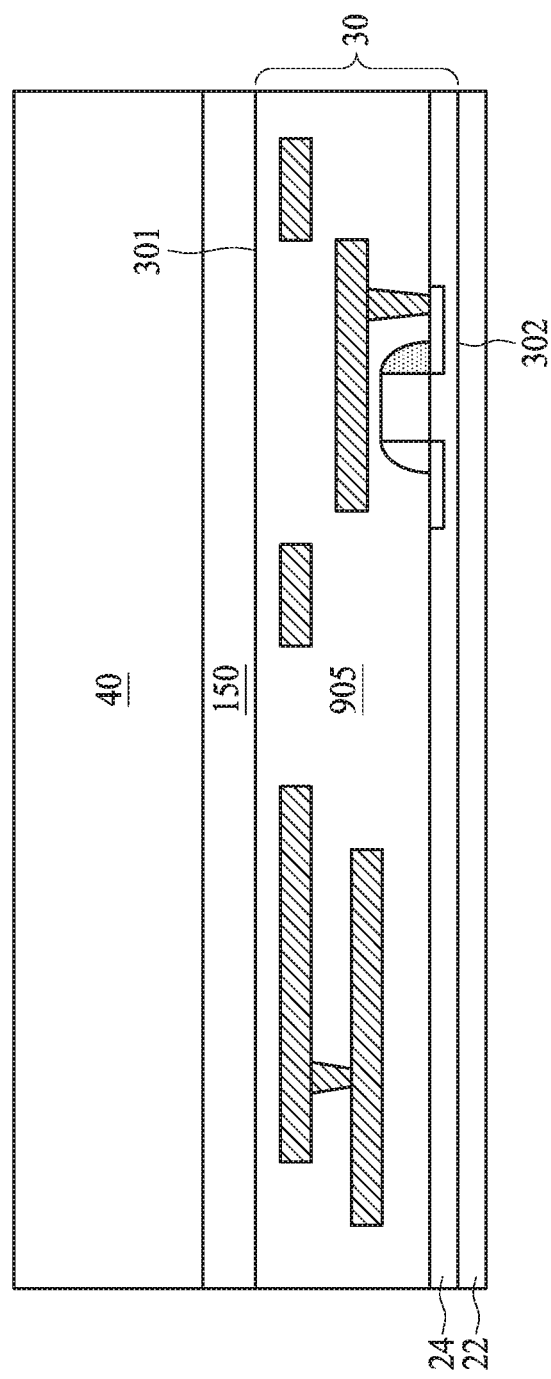

FIG. 9A and FIG. 9B depict two scenarios of how the etch selectivity layer 22 works according to an ingredient of the the etch selectivity layer 22. In FIG. 9A, the etch selectivity layer 22 includes SiGe with Ge concentration (in atomic percent) of about 10% to about 100%. Subsequent to bonding the primary substrate 10 to the semiconductor substrate 40, the primary substrate 10 and the epitaxial buffer layer 20 are removed as shown in FIG. 9A. Removal of the primary substrate 10 and the epitaxial buffer layer 20 is accomplished in preferably two steps, that is, grinding approximately 90 percent of the primary substrate 10 and thereafter selectively etching a remaining portion of the primary substrate 10 and the epitaxial buffer layer 20. Compared to conventional sequence of grinding, lapping, wet etching, and/or chemical mechanical polishing to substantially reduce the thickness of the primary substrate 10, the present disclosure provides that removal of a substantial portion of primary substrate 10 can be accomplished by subjecting the structure to a only a grinding and a wet etching operation. Due to a high selectivity between the primary substrate 10 and the etch selectivity layer 22 containing SiGe, the etch selectivity layer 22 can function as an abrupt etch stop layer exposed after the wet etching operation.

The grinding operation of the present disclosure can include a coarse grinding and a fine grinding. A backside 10' of the primary substrate 10 shown in FIG. 4 is grounded with a conventional grinder using a relatively coarse grinding wheel such as a D46 grind wheel or a 320 grit grind wheel to thin the primary substrate 10. In this coarse grinding step, a substantial portion, but not the entire thickness of the primary substrate 10 is removed. The amount of material removed in this coarse grinding step is determined, in part, by the total roughness of the silicon surface after the coarse grinding and the additional process steps which will be required to eliminate the roughness and damage created during the coarse grinding step. Preferably, the average surface roughness after the coarse grinding step is less than about 0.5 µm, more preferably less than about 0.3 µm, and the total surface roughness after the coarse grinding step is less than about 5 µm, more preferably less than 3 µm. The average roughness, and the total surface roughness for a coarse ground surface may be determined using a profilometer with the average roughness, being measured over a one square-centimeter area.

To remove the roughness and damage created in the coarse grinding step, the surface of the device wafer is preferably subjected to a second grinding step, i.e., the fine grinding step. For fine grinding, a 1200 mesh finish grinding wheel may be used. The amount of material removed in the fine grinding step is at least about three times, preferably at least about five times the total surface roughness value of the silicon surface after the coarse grinding step. Fine grinding, however, imparts its own roughness and damage to the silicon surface and typically, the silicon surface after the fine grinding step will have an average surface roughness of less than 0.1 µm, more preferably less than about 0.02 µm, and a total surface roughness of less than about 0.75 µm. The average roughness and the total surface roughness, RT, for a fine ground surface may be determined using a profilometer which is capable of measuring roughness values of a nanometer or less, with the average roughness being measured over a one square-centimeter area.

The thinned primary substrate 10, after grinding, has an exposed surface and a thickness of about 20 to about 35 micrometers, more preferably, about 25 to about 30 micrometers. In addition, the grinding process should be controlled to minimize the TTV across the ground wafer. For a 200 millimeter diameter wafer, for example, the TTV should be less than 2 micrometers, more preferably less than 0.8 micrometers and even more preferably no more than about 0.5 micrometers.

Although the remaining thickness of the primary substrate 10 may be removed by selective etching, the selective etchants remove silicon at a relatively slow rate. To improve throughput, therefore, it is preferred that the bulk of the primary substrate 10 be mechanically removed by grinding and that roughness and damage created in the grinding process be removed prior to wet etching. The wet chemical etchant of the present disclosure may include Tetramethylammonium hydroxide (TMAH) with respect to the scenario of SiGe-containing material being employed as an etch selectivity layer 22. TMAH can be utilized for smooth grinding the remaining primary substrate 10 and the epitaxial buffer layer 20 at a rate of about 0.2 micrometers per minute at about 60 degrees Celsius. At the same temperature, the etching rate of the etch selectivity layer 22 having about 20% Ge is merely 90 angstroms per minute. As such, the etch selectivity layer 22 can function as an abrupt etch stop layer exposed after the wet etching operation, and the silicon epitaxial layer 24 can remain intact. In some embodiments, the etch selectivity layer 22 containing SiGe may be further removed. However, this is not a limitation of the present disclosure.

Under a condition where the etch selectivity layer 22 containing dopants of Group III to Group V elements of the Periodic Table, such as boron, carbon, phosphors and arsenic as mentioned above, the silicon epitaxial layer 24 can function as an abrupt etch stop layer. Before wet etch, most of the primary substrate 10 and the epitaxial buffer layer 20 underlying the boron doped etch selectivity layer 22 are removed by grinding and polishing in a way similar to FIG. 9A. The boron doped etch selectivity layer 22 is then selectively etched by etchant comprised of hydrofluoric acid, nitric acid, and acetic acid in the ratio of 3:5:3 parts by weight ($HF:HNO_3:CH_3COOH$) which is commonly referred to as HNA. With this etchant, nominal selectivity ratios of 100:1 are reported for the etch rate of the heavily boron doped etch selectivity layer 22 compared to etch rates of undoped silicon epitaxial layer 24. A second trimming may be further provided to fine tuning the roughness of the etched surface. The second trimming may be used to remove a thin layer of the silicon film of the silicon epitaxial layer 24 since the heavily doped etch selectivity layer 22 has been substantially consumed as shown in FIG. 9B. For example, a planarization operation is performed after the etching, and then another etchant with a slower etching rate compared to the aforesaid etchant is applied to the rough surface in order to achieve desired surface roughness. The second trimming discussed above cannot alleviate said large surface roughness.

Figure 10A:
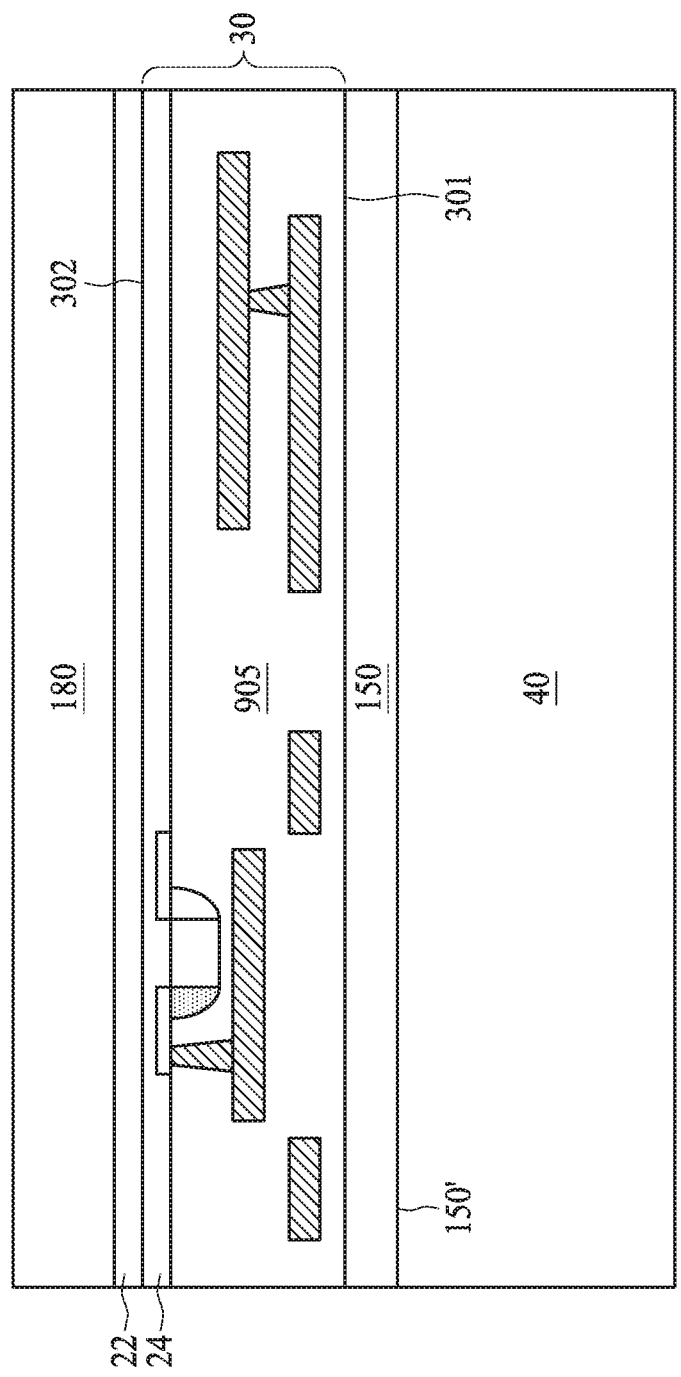
Figure 11A:
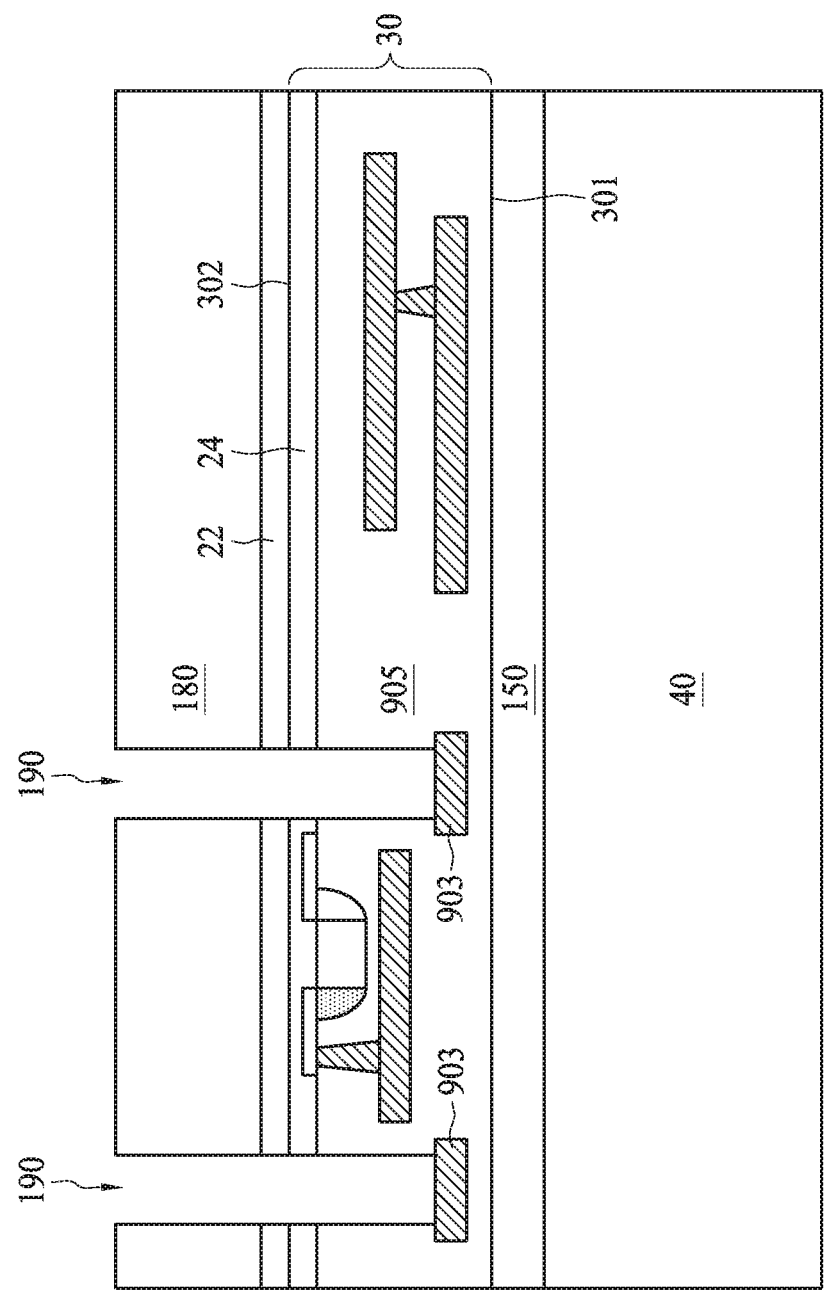
Figure 12A:
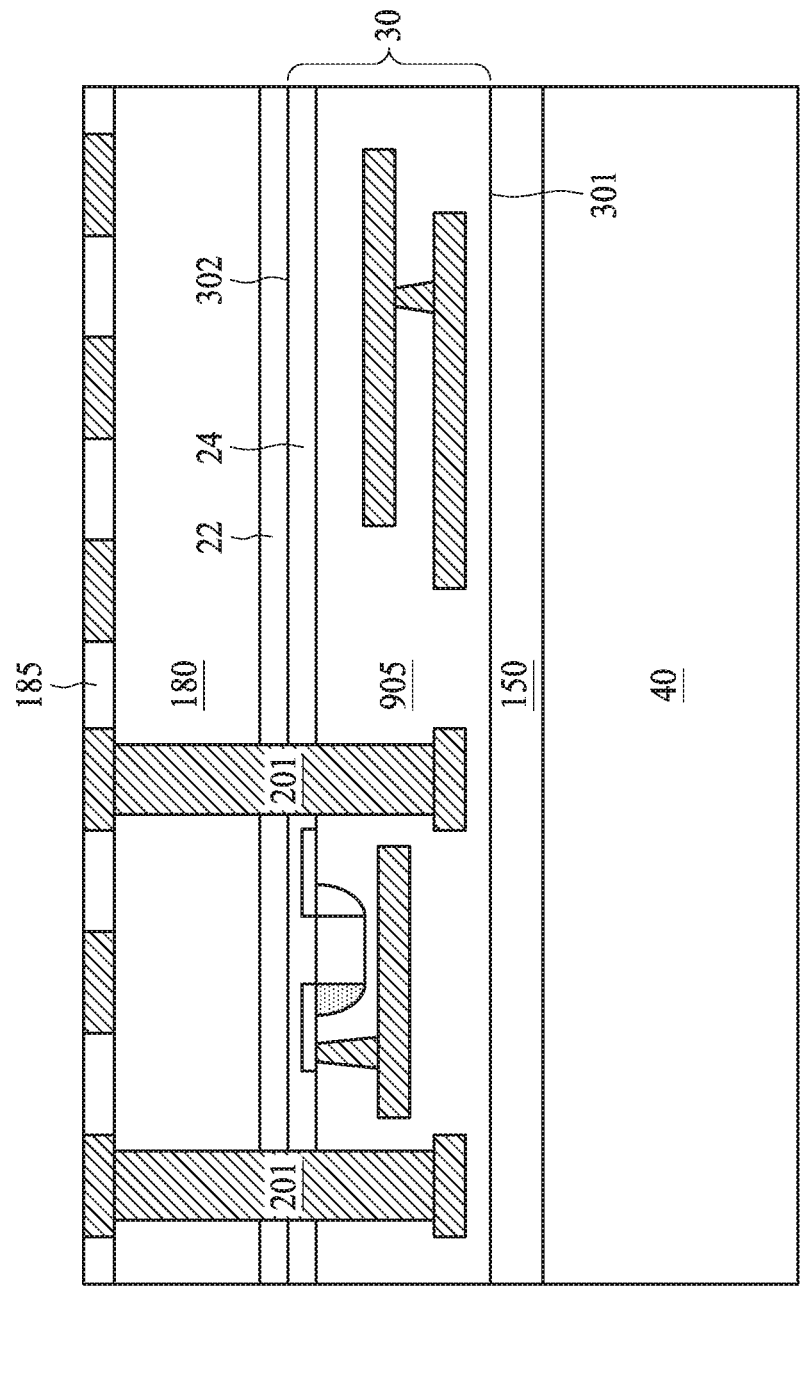

FIGS. 10A, 11A and 12A are schematic cross-sectional views depict the sequence of operations for fabrication the semiconductor structure based on the condition of FIG. 9A. In FIG. 10A, a dielectric layer 180, such as an oxide layer, is formed over the exposed surface of the etch selectivity layer 22 of FIG. 9A. In some embodiments, the total thickness variation (TTV) between the dielectric layer 180 and the etch selectivity layer 22 can be measured to be about 150 nm according to some of the manufacturing methods described herein. The dielectric layer 180 is provided which may be used as an insulating layer in order to form a reverse SOI structure together with the device layer 30. In FIG. 11A, a through hole 190 is patterned and etched from the surface of the dielectric layer 180, through the etch selectivity layer 22, the device layer 30, and arrive the specific MLI 903 designed for receiving the through hole. In FIG. 12A, conductive material is filled into the through hole 190 and form through-silicon vias (TSVs) 201 in a semiconductor structure 200. Generally, TSVs 201 are formed by etching a vertical hole through a substrate and filling the hole with a conductive material, such as copper. The TSVs 201 may be used to provide an electrical contact over semiconductor circuitry on a front side of the device layer 30 to semiconductor circuitry on the backside of the device layer 30, or to provide an electrical contact to semiconductor circuitry on a stacked die (not shown). Generally, the process used to form TSVs 201 involves etching a hole at least partially through the silicon substrate of the device layer 30 and, possibly, the overlying dielectric layers 180, 185, the underlying ILD 905, and then depositing copper in the hole. The semiconductor structure 200 of FIG. 12A can be viewed as a reverse SOI structure with respect to an existing SOI structure.

Figure 10B:
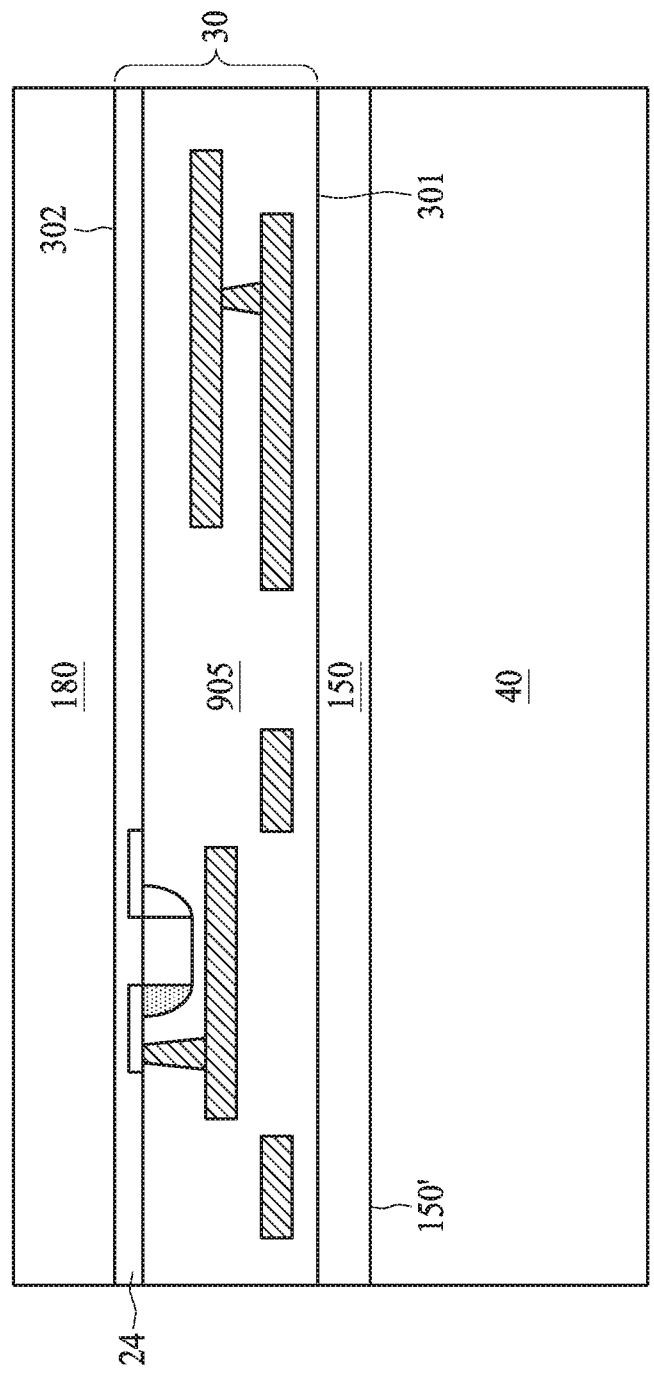
Figure 11B:
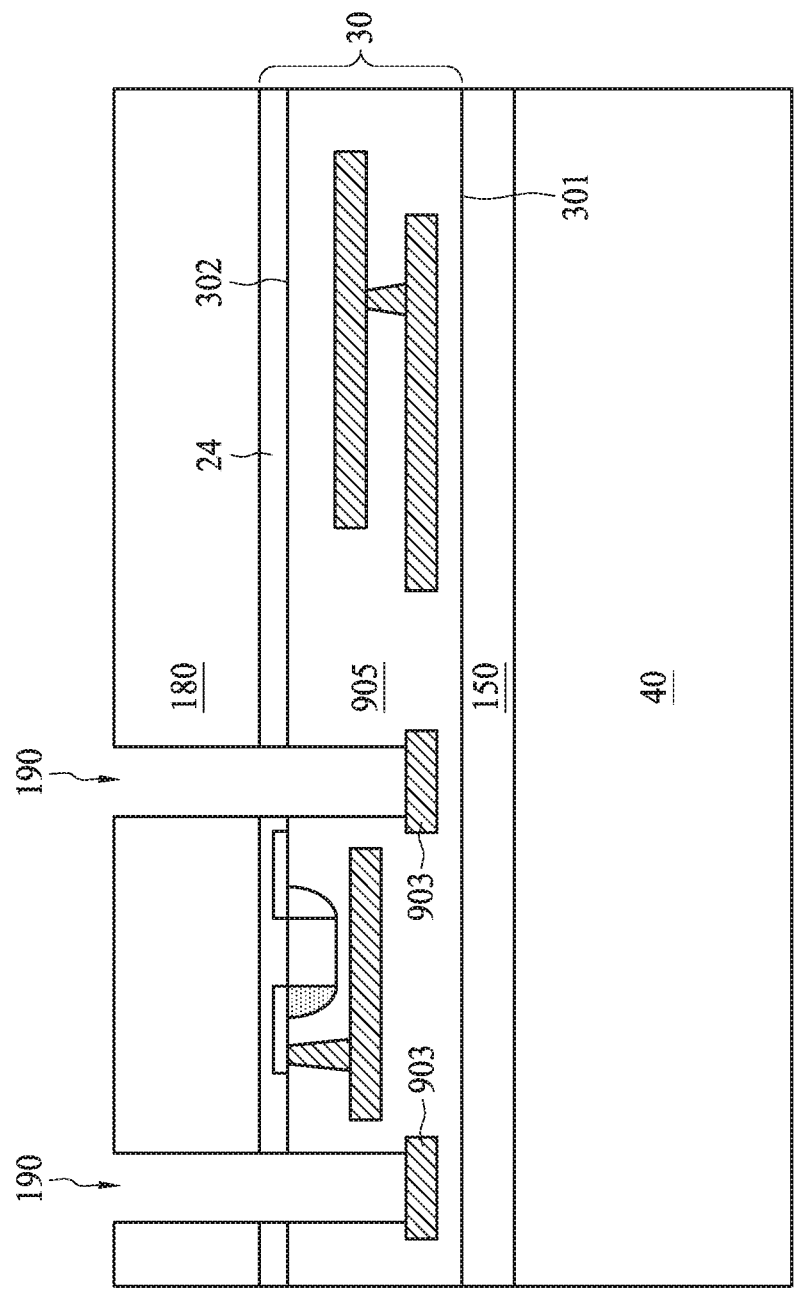
Figure 12B:
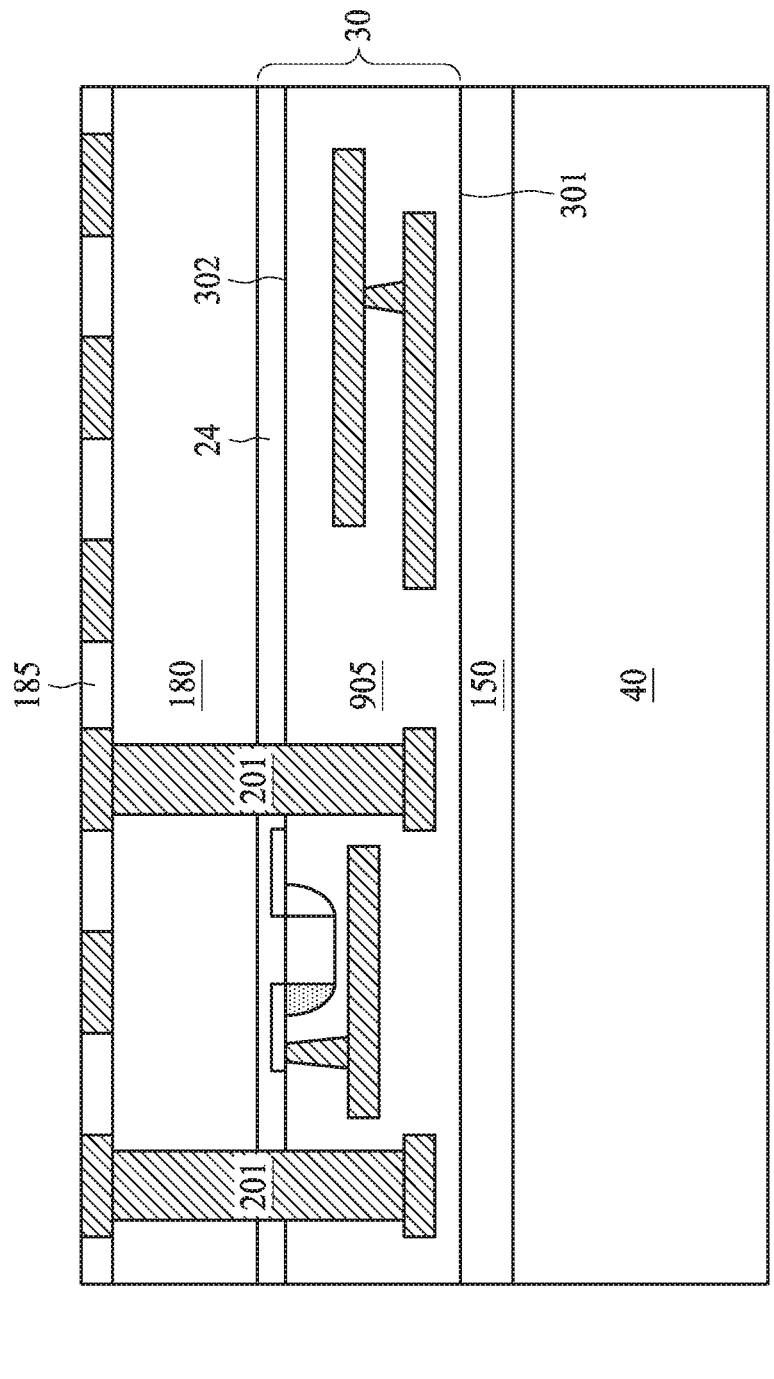

FIGS. 10B, 11B and 12B are schematic cross-sectional views depict the sequence of operations for fabrication the semiconductor structure based on the condition of FIG. 9B. In FIG. 10B, a dielectric layer 180, such as an oxide layer, is formed over the exposed surface of the silicon epitaxial layer 24 of FIG. 9B. In some embodiments, the total thickness variation (TTV) between the dielectric layer 180 and the silicon epitaxial layer 24 can be measured to be about 10 nm according to some of the manufacturing methods described herein. The dielectric layer 180 is provided which may be used as an insulating layer in order to form a reverse SOI structure together with the device layer 30. In FIG. 11B, a through hole 190 is patterned and etched from the surface of the dielectric layer 180, through the device layer 30, and arrive the specific MLI 903 designed for receiving the through hole. In FIG. 12B, conductive material is filled into the through hole 190 and form TSVs 201 in a semiconductor structure 202. Generally, TSVs 201 are formed by etching a vertical hole through a substrate and filling the hole with a conductive material, such as copper. The TSVs 201 may be used to provide an electrical contact over a front side of the device layer 30 to semiconductor circuitry on the backside of the device layer 30, or to provide an electrical contact to semiconductor circuitry on a stacked die (not shown). Generally, the process used to form TSVs 201 involves etching a hole at least partially through the silicon substrate of the device layer 30 and, possibly, the overlying dielectric layers 180, 185, the underlying ILD 905, and then depositing copper in the hole. The semiconductor structure 202 of FIG. 12B can be viewed as a reverse SOI structure with respect to an existing SOI structure.

One embodiment in the present disclosure provides a semiconductor structure, including: a semiconductor device layer including a first surface and a second surface, wherein the first surface is at a front side of the semiconductor device layer, and the second surface is at a backside of the semiconductor device layer; an insulating layer above the second surface of the semiconductor device; and a through-silicon via (TSV) traversing the insulating layer.

One embodiment in the present disclosure provides a manufacturing method of a semiconductor structure. The method includes: providing a temporary substrate; forming an etch stop layer over the temporary substrate; forming a semiconductor device layer over the etch stop layer; removing the temporary substrate; forming an insulating layer over a backside of the semiconductor device layer; and forming a through-silicon via (TSV) traversing the insulating layer.

One embodiment in the present disclosure provides a manufacturing method of a semiconductor structure. The method includes: providing a temporary substrate; forming a selectivity layer over the temporary substrate; forming a semiconductor device layer over the selectivity layer; removing the temporary substrate and the selectivity layer; forming an insulating layer over a backside of the semiconductor device layer; and forming a through-silicon via (TSV) traversing the insulating layer.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A manufacturing method of a semiconductor structure, comprising:
    providing a temporary substrate;
    forming an epitaxial buffer layer including P-silicon epitaxial in contact with and over the temporary substrate;
    forming an epitaxial etch selectivity layer in contact with and over the epitaxial buffer layer, wherein the epitaxial etch selectivity layer has a thickness about 200 nm;
    forming a semiconductor device layer including a transistor in contact with and over the epitaxial etch selectivity layer, wherein the semiconductor device layer includes an active region of a semiconductor device and metallization layers;
    removing the temporary substrate and the epitaxial buffer layer;
    forming an insulating layer over a first side of the semiconductor device layer, so that the insulating layer being in contact with the epitaxial etch selectivity layer, and the active region being between the insulating layer and the metallization layers; and
    after the formation of the insulating layer, etching the insulating layer, the epitaxial etch selectivity layer, the semiconductor device layer to form a through hole passing through the insulating layer, the epitaxial etch selectivity layer and extending into the semiconductor device layer, wherein the epitaxial etch selectivity layer and the device layer are exposed through a sidewall of the through hole, and the epitaxial etch selectivity layer and the insulating layer fully covers the first side of the device layer except at the through hole; and
    forming a through-silicon via (TSV) traversing the insulating layer in the through hole;
    wherein the formation of the epitaxial etch selective layer in contact with and over the epitaxial buffer layer includes:
        forming the epitaxial etch selectivity layer by gradually increasing a concentration of germanium in the epitaxial etch selectivity layer from about 0% around an interface between the epitaxial buffer layer and the epitaxial etch selectivity layer to about 20% to about 30% within 40 nm distanced from the interface between the epitaxial buffer layer and the epitaxial etch selectivity layer, and gradually decreasing the concentration of germanium in the epitaxial etch selectivity layer from about 20% to about 30% within 40 nm distanced from an interface between the epitaxial etch selectivity layer and the semiconductor device layer to about 0% around the interface between the epitaxial etch selectivity layer and the semiconductor device layer.

2. The manufacturing method of claim 1, wherein the removing of the temporary substrate comprises grinding the temporary substrate.

3. The manufacturing method of claim 1, wherein the formation of the epitaxial buffer layer comprises depositing the epitaxial buffer layer to have a thickness of about 3.5 µm.

4. The manufacturing method of claim 3, wherein the formation of the epitaxial etch selectivity layer over the epitaxial buffer layer comprises forming silicon germanium (SiGe).

5. The manufacturing method of claim 1, wherein the removing of the temporary substrate comprises performing a hydrofluoric acid/nitric acid/acetic acid (HNA) etch.

6. The manufacturing method of claim 1, wherein the formation of the TSV traversing the insulating layer comprises forming the TSV to couple the device layer to semiconductor circuitry on the first side of the device layer.

7. The manufacturing method of claim 1, wherein the removing of the temporary substrate and the epitaxial buffer layer comprises:
    performing a Tetramethylammonium hydroxide (TMAH) etch.

8. A manufacturing method of a semiconductor structure, comprising:
    providing a temporary substrate;
    forming an epitaxial tri-layer structure over the temporary substrate, the step of forming an epitaxial tri-layer structure comprising:
        forming an epitaxial buffer layer in contact with and over the temporary substrate;
        forming an epitaxial etch stop layer in contact with and over the epitaxial buffer layer, wherein the epitaxial etch stop layer has a thickness about 200 nm, and the epitaxial etch stop layer comprises carbon, phosphors, gallium, nitrogen or arsenic doped into silicon; and
        forming a silicon epitaxial layer in contact with and over the epitaxial etch stop layer;
    forming an active region of a semiconductor device in the silicon epitaxial layer;
    forming an ILD layer over the silicon epitaxial layer, wherein the ILD layer includes metallization layers, and the silicon epitaxial layer and the ILD layer together form a device layer including a transistor;
    removing the temporary substrate;
    forming an insulating layer over a first side of the device layer, so that the insulating layer being in contact with the epitaxial etch stop layer, and the active region being between the insulating layer and the metallization layers; and
    after the formation of the insulating layer, etching the insulating layer, the epitaxial etch stop layer, the silicon epitaxial layer and the ILD layer to form a through hole passing through the insulating layer, the epitaxial etch stop layer, the silicon epitaxial layer and extending into the ILD layer, wherein the epitaxial etch stop layer and the device layer are exposed through a sidewall of the through hole, and the epitaxial etch stop layer and the insulating layer fully covers the first side of the device layer except at the through hole; and forming a through-silicon via (TSV) traversing the insulating layer in the through hole;

wherein the formation of the epitaxial etch stop layer over the epitaxial buffer layer includes:

forming the epitaxial etch stop layer by gradually increasing a concentration of germanium in the epitaxial etch stop layer from about 0% around an interface between the epitaxial buffer layer and the epitaxial etch stop layer to about 20% to about 30% within 40 nm distanced from the interface between the epitaxial buffer layer and the epitaxial etch stop layer, and gradually decreasing the concentration of germanium in the epitaxial etch stop layer from about 20% to about 30% within 40 nm distanced from an interface between the epitaxial etch stop layer and the silicon epitaxial layer to about 0% around the interface between the epitaxial etch stop layer and the silicon epitaxial layer.

9. The manufacturing method of claim 8, further comprising bonding a carrier substrate to a front side of the device layer before the removing of the temporary substrate.

10. The manufacturing method of claim 9, further comprising forming a dielectric layer over the front side of the device layer, and the bonding the carrier substrate to the front side of the device layer before the removing of the temporary substrate includes:

bonding the carrier substrate to the dielectric layer before the removing of the temporary substrate.

11. The manufacturing method of claim 8, wherein the removing of the temporary substrate comprises grinding the temporary substrate.

12. The manufacturing method of claim 8, wherein the formation of the epitaxial etch stop layer in contact with and over the epitaxial buffer layer comprises forming silicon germanium (SiGe).

13. The manufacturing method of claim 12, wherein the removing of the temporary substrate comprises performing a Tetramethylammonium hydroxide (TMAH) etch.

14. The manufacturing method of claim 8, wherein the formation of the epitaxial buffer layer comprises depositing the epitaxial buffer layer to have a thickness of about 3.5 µm.

15. The manufacturing method of claim 8, wherein the formation of the TSV traversing the insulating layer comprises forming the TSV to couple the ILD layer to semiconductor circuitry on the first side of the device layer.

16. A manufacturing method of a semiconductor structure, comprising:

providing a temporary substrate;

forming an epitaxial tri-layer structure over the temporary substrate, the step of forming an epitaxial tri-layer structure comprising:

forming an epitaxial buffer layer including P-silicon epitaxial in contact with and over the temporary substrate;

forming an epitaxial etch selectivity layer in contact with and over the epitaxial buffer layer, wherein the epitaxial etch selectivity layer has a thickness about 200 nm, and the epitaxial etch selectivity layer comprises carbon, phosphors, gallium, nitrogen or arsenic doped into silicon; and forming a silicon epitaxial layer in contact with and over the epitaxial etch selectivity layer, wherein the silicon epitaxial layer has a thickness about 100 nm;

forming an active region of a semiconductor device in the silicon epitaxial layer;

forming an ILD layer over the silicon epitaxial layer, wherein the ILD layer includes metallization layers, and the silicon epitaxial layer and the ILD layer together form a device layer including a transistor;

removing the temporary substrate and the epitaxial buffer layer, wherein the silicon epitaxial layer and the ILD layer has a total thickness of 1.5 µm to 5 µm;

forming an insulating layer over a first side of the silicon epitaxial layer, so that the insulating layer being in contact with the epitaxial etch selectivity layer, and the active region being between the insulating layer and the metallization layers; and after the formation of the insulating layer, etching the insulating layer, the epitaxial etch selective layer, the silicon epitaxial layer and the ILD layer to form a through hole passing through the insulating layer, the epitaxial etch selective layer, the silicon epitaxial layer and extending into, wherein the epitaxial etch selectivity layer and the device layer are exposed through a sidewall of the through hole, and the epitaxial etch selectivity layer and the insulating layer fully covers the first side of the device layer except at the through hole; and forming a through-silicon via (TSV) traversing the insulating layer in the through hole;

wherein the formation of the epitaxial etch selectivity layer in contact with and over the epitaxial buffer layer includes:

forming the epitaxial etch selectivity layer by gradually increasing a concentration of germanium in the epitaxial etch selectivity layer from about 0% around an interface between the epitaxial buffer layer and the epitaxial etch selectivity layer to about 20% to about 30% within 40 nm distanced from the interface between the epitaxial buffer layer and the epitaxial etch selectivity layer, and gradually decreasing the concentration of germanium in the epitaxial etch selectivity layer from about 20% to about 30% within 40 nm distanced from an interface between the epitaxial etch selectivity layer and the silicon epitaxial layer to about 0% around the interface between the epitaxial etch selectivity layer and the silicon epitaxial layer.

17. The manufacturing method of claim 16, wherein the formation of the epitaxial buffer layer comprises depositing the epitaxial buffer layer to have a thickness of about 3.5 µm.

18. The manufacturing method of claim 16, wherein the forming of the TSV further comprises filling a conductive material into the through hole.

19. The manufacturing method of claim 16, wherein the formation of the epitaxial etch selectivity layer over the epitaxial buffer layer comprises forming silicon germanium (SiGe).

20. The manufacturing method of claim 16, wherein the removing of the temporary substrate and the epitaxial buffer layer comprises:

performing a Tetramethylammonium hydroxide (TMAH) etch.

* * * * *

UNITED STATES PATENT AND TRADEMARK OFFICE
CERTIFICATE OF CORRECTION

PATENT NO. : 11,049,797 B2  
APPLICATION NO. : 15/130182  
DATED : June 29, 2021  
INVENTOR(S) : Cheng et al.

Page 1 of 1

It is certified that error appears in the above-identified patent and that said Letters Patent is hereby corrected as shown below:

On the Title Page

Item (54), and in the Specification Column 1 Lines 1-6 title should be corrected to read:
METHOD FOR MANUFACTURING A SEMICONDUCTOR STRUCTURE COMPRISING A SEMICONDUCTOR DEVICE LAYER FORMED ON A TEMPORARY SUBSTRATE HAVING A GRADED SiGe ETCH STOP LAYER THERE BETWEEN Signed and Sealed this  
Third Day of May, 2022

Katherine Kelly Vidal  
*Director of the United States Patent and Trademark Office*